(12) United States Patent
Ozeki

(10) Patent No.: US 8,427,208 B2
(45) Date of Patent: Apr. 23, 2013

(54) PHASE INTERPOLATOR AND SEMICONDUCTOR CIRCUIT DEVICE

(75) Inventor: Yoshitomo Ozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/369,847

(22) Filed: Feb. 9, 2012

(65) Prior Publication Data

US 2012/0139591 A1    Jun. 7, 2012

Related U.S. Application Data

(63) Continuation of application No. PCT/JP2009/004065, filed on Aug. 24, 2009.

(51) Int. Cl.
*H03L 7/06* (2006.01)
(52) U.S. Cl.
USPC .......................................... 327/148; 327/157
(58) Field of Classification Search .................. 327/148, 327/157
See application file for complete search history.

(56) References Cited

U.S. PATENT DOCUMENTS

| 6,900,681 | B2 | 5/2005 | Takano | |
|---|---|---|---|---|
| 7,545,187 | B2 * | 6/2009 | Iwaida et al. | 327/156 |
| 7,772,898 | B2 * | 8/2010 | Cheung | 327/158 |
| 7,956,657 | B2 * | 6/2011 | Lim et al. | 327/158 |
| 2003/0198105 | A1 | 10/2003 | Yamaguchi | |
| 2007/0177700 | A1 | 8/2007 | Saeki | |
| 2009/0179674 | A1 | 7/2009 | Tamura | |

FOREIGN PATENT DOCUMENTS

JP         2005-260787         9/2005

OTHER PUBLICATIONS

International Search Report of PCT/JP2009/004065 mailed Sep. 15, 2009.

* cited by examiner

*Primary Examiner* — Hai L Nguyen
(74) *Attorney, Agent, or Firm* — Staas & Halsey LLP

(57) ABSTRACT

A first mixer generates a first and a second clock signal having a phase opposite to that of the first clock signal. A second mixer generates a third clock signal having a phase lead angle of 90 degrees with respect to the first clock signal and a fourth clock signal having a phase opposite to that of the third clock signal. An ADC generates a digital signal from a signal that is generated on the basis of a composite signal of a voltage signal formed on the basis of the exclusive OR of the first and the third clock signal and a voltage signal formed on the basis of the exclusive OR of the second and the fourth clock signal. An adder adds the digital signal to the first control signal to generate the second control signal and supplies the second control signal to the second mixer.

7 Claims, 9 Drawing Sheets

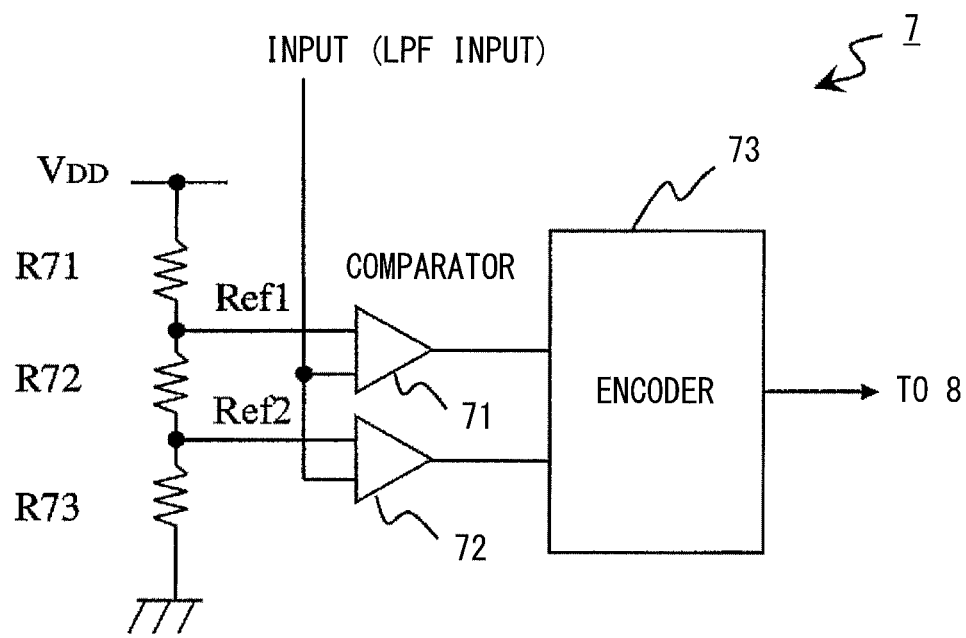
F I G. 5

PHASE INTERPOLATOR AND SEMICONDUCTOR CIRCUIT DEVICE

CROSS-REFERENCE TO RELATED APPLICATIONS

This application is a continuation of PCT application PCT/JP2009/004065 which was filed on Aug. 24, 2009, the entire contents of which are incorporated herein by reference.

FIELD

The present invention discussed herein relates to a phase interpolator and a semiconductor circuit device.

BACKGROUND

Methods for transferring a signal between semiconductor devices include an embedded method that includes embedding a clock in data. As illustrated in FIG. 9, in an embedded method, edges are recognized in a transmitted signal, and clock signals CLK1 and CLK1B are reproduced on the basis of the edges. The signal CLK1B is a signal with a phase having a phase lead angle of 180 degrees with respect to the signal CLK1.

In one of embedded methods which uses both of an up-edge and a down-edge of a clock as triggers for data, clock signals CLK2 and CLK2B having phase lead angles of 90 degrees are generated from reproduced clock signals CLK1 and CLK1B, and data is taken in from a transmitted signal by using the clock signals. The signal CLK2B is a signal having a phase lead angle of 180 degrees with respect to the signal CLK2. For this reason, data can be taken in at the center of a signal period which has a lead angle of 90 degrees with respect to an edge. That is, in this case, the first half of an up or down period of a signal is a setup period while the second half of an up or down period of the signal is a hold period.

There is known a process of a variable 45 degrees phase-shift circuit of receiving a feedback signal and changing a characteristic value of the circuit, thereby adjusting a phase lead angle to 0 degrees and an angle of phase difference to 45 degrees.

There is also known a process of inputting, transforming, and outputting a differential clock signal whose phase with data is adjusted and feeding back a signal generated on the basis of the differential clock signal to control an amount of transformation for a differential clock signal.

PRIOR ART DOCUMENTS

Patent Documents

[Patent Document 1] Japanese Laid-Open Patent Publication No. 2005-260787
[Patent Document 2] Japanese Laid-Open Patent Publication No. 2004-297404

SUMMARY

The disclosed phase interpolator includes a selector, a first mixer, a second mixer, a first phase detector, a second phase detector, a first charge pump circuit, a second charge pump circuit, an analog digital converter, and an adder. The selector supplies four-phase clock signals to the first mixer and the second mixer. The first mixer generates a first clock signal having a first phase lead angle and a second clock signal having a phase lead angle of 180 degrees with respect to the first clock signal on the basis of the clock signals supplied from the selector according to a first control signal defining the first clock signal and the second clock signal to be generated and the first phase lead angle to be given to the clock signals. The second mixer generates a third clock signal having a phase lead angle of 90 degrees with respect to the first clock signal and a fourth clock signal having a phase lead angle of 270 degrees with respect to the first clock signal on the basis of the clock signals supplied from the selector according to a second control signal defining the third clock signal and the fourth clock signal to be generated and the second phase lead angle to be given to the clock signals. The first phase detector computes an exclusive OR of the first clock signal output from the first mixer and the third clock signal output from the second mixer. The second phase detector computes an exclusive OR of the second clock signal output from the first mixer and the fourth clock signal output from the second mixer. The first charge pump circuit converts the exclusive OR output from the first phase detector to a first voltage signal. The second charge pump circuit converts the exclusive OR output from the second phase detector to a second voltage signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of an analog digital converter (ADC)

DESCRIPTION OF EMBODIMENTS

Figure 1:
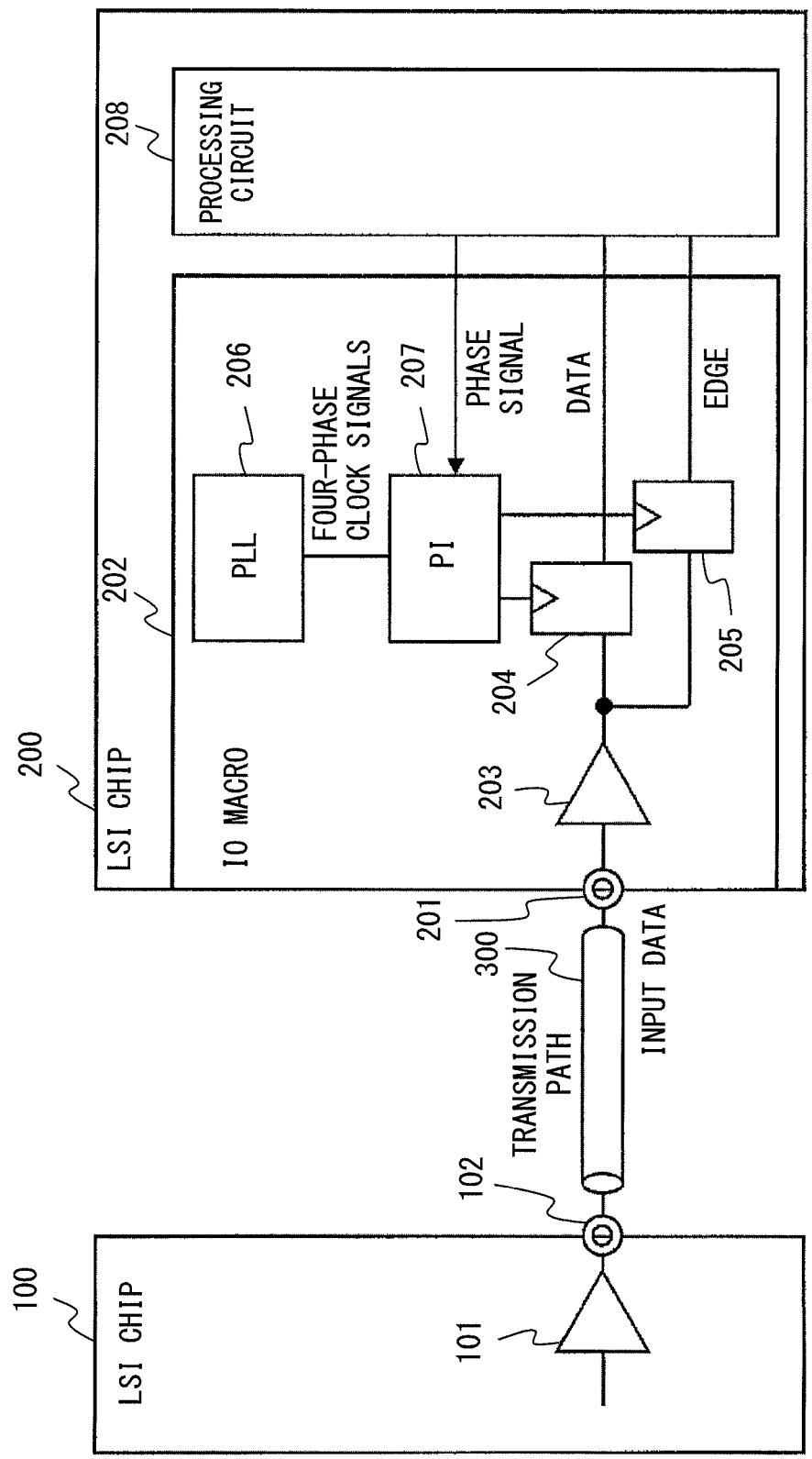
FIG. 1 is a diagram illustrating an example of a semiconductor device including a phase interpolator.

For extraction of correct data from a transmitted signal, the timing to take in data is preferably close to the center of a signal period because provision of a margin is easier both for a setup period and a hold period. In other words, provision of margins for a setup period and a hold period is easier when the clock signals CLK2 and CLK2B have phase lead angles of 90 degrees with respect to clock signals CLK1 and CLK1B, respectively. Accordingly, it is desirable to generate four clock signals (four-phase clock signals) CLK1, CLK1B, CLK2, and CLK2B having phase lead angles of exactly 90 degrees with respect to each other.

Such four-phase clock signals are generated using a phase interpolator. However, there are variations in temperature characteristic, voltage characteristic, frequency characteristic, and the like among internal transistors (MOSFETs) of phase interpolators due to manufacturing variations. For this reason, variations in temperature characteristic, voltage characteristic, frequency characteristic, and the like need to be taken into consideration when phase lead angles between four-phase clock signals are to be set to exactly 90 degrees.

It is an object of the present invention to provide a phase interpolator which outputs four-phase clock signals having phase lead angles of exactly 90 degrees with respect to each other.

The disclosed phase interpolator includes a selector, a first mixer, a second mixer, a first phase detector, a second phase detector, a first charge pump circuit, a second charge pump circuit, an analog digital converter, and an adder. The selector supplies four-phase clock signals to the first mixer and the second mixer. The first mixer generates a first clock signal having a first phase lead angle and a second clock signal having a phase lead angle of 180 degrees with respect to the first clock signal on the basis of the clock signals supplied from the selector according to a first control signal defining the first clock signal and the second clock signal to be generated and the first phase lead angle to be given to the clock signals. The second mixer generates a third clock signal having a phase lead angle of 90 degrees with respect to the first clock signal and a fourth clock signal having a phase lead angle of 270 degrees with respect to the first clock signal on the basis of the clock signals supplied from the selector according to a second control signal defining the third clock signal and the fourth clock signal to be generated and the second phase lead angle to be given to the clock signals. The first phase detector computes an exclusive OR of the first clock signal output from the first mixer and the third clock signal output from the second mixer. The second phase detector computes an exclusive OR of the second clock signal output from the first mixer and the fourth clock signal output from the second mixer. The first charge pump circuit converts the exclusive OR output from the first phase detector to a first voltage signal. The second charge pump circuit converts the exclusive OR output from the second phase detector to a second voltage signal. The analog digital converter generates a digital signal from a signal generated on the basis of a composite signal of the first voltage signal output from the first charge pump circuit and the second voltage signal output from the second charge pump circuit. The adder adds the digital signal output from the analog digital converter to the first control signal to generate the second control signal and supplies the second control signal to the second mixer.

FIG. 1 is a diagram illustrating an example of a data transmission and reception system having a sending-side semiconductor integrated circuit device and a receiving-side semiconductor integrated circuit device including a phase interpolator.

The data transmission and reception system in FIG. 1 includes a sending-side semiconductor integrated circuit device (hereinafter referred to as a sending-side LSI chip) 100, a receiving-side semiconductor integrated circuit device (hereinafter referred to as a receiving-side LSI chip) 200, and a transmission path 300 which connects the LSI chips 100 and 200. The sending-side LSI chip 100 for sending an input signal includes an output terminal 102 which is connected to an output buffer circuit 101. The receiving-side LSI chip 200 for receiving an input signal includes an input terminal 201. The transmission path 300 connects the output terminal 102 and the input terminal 201. The sending-side LSI chip 100 sends input data from the output buffer circuit 101 to the LSI chip 200 via the transmission path 300. An example of the input data is a serial signal which is sent with a clock embedded in data, i.e., in a so-called embedded manner.

The receiving-side LSI chip 200 includes an IO macro 202 and a processing circuit 208. The IO macro 202 is an input circuit cell. The IO macro 202 extracts pieces of data and edges from an input signal received from the sending-side LSI chip 100 and inputs the pieces of data and edges to the processing circuit 208. The processing circuit 208 is a circuit which performs predetermined processes such as a process of reproducing a clock from data and edge information of an input signal and data communication. The IO macro 202 includes an input buffer circuit 203, a data output circuit 204, an edge output circuit 205, a PLL (Phase Locked Loop) 206, and a phase interpolator (PI) 207.

Input data transmitted via the transmission path 300 is input to the input buffer circuit 203 via the input terminal 201. The input buffer circuit 203 inputs the received input data to the data output circuit 204 and edge output circuit 205.

The PLL 206 generates four-phase clock signals and supplies the clock signals to the phase interpolator 207. The four-phase clock signals are clocks having phase lead angles of 0 degrees, 90 degrees, 180 degrees, and 270 degrees, respectively. The clock having a phase lead angle of 0 degrees is a signal having a phase lead angle of 0 degrees. The clock having a phase lead angle of 90 degrees is a signal having a phase lead angle of 90 degrees with respect to the clock having a phase lead angle of 0 degrees. The same applies to the other signals.

The phase interpolator 207 generates four-phase clock signals CLK11, CLK12, CLK13, and CLK14 on the basis of the four-phase clock signals input from the PLL 206.

The clock signal CLK11 is a clock signal having a phase lead angle of $\alpha$. The phase lead angle of $\alpha$ is a desired phase lead angle which depends on the phase of input data. The clock signal CLK12 is a clock signal having a phase lead angle of ($\alpha$+90 degrees) and is a clock signal having a phase lead angle of 90 degrees with respect to the clock signal CLK11. The clock signal CLK13 is a clock signal having a phase lead angle of ($\alpha$+180 degrees) and is a clock signal having a phase lead angle of 180 degrees with respect to the clock signal CLK11. The clock signal CLK14 is a clock signal having a phase lead angle of ($\alpha$+270 degrees) and is a clock signal having a phase lead angle of 270 degrees with respect to the clock signal CLK11. The four-phase clock signals will be described later.

The phase interpolator 207 supplies the clock signal CLK12 and clock signal CLK14 to the data output circuit 204. The phase interpolator 207 supplies the clock signal CLK11 and clock signal CLK13 to the edge output circuit 205.

Figure 9:
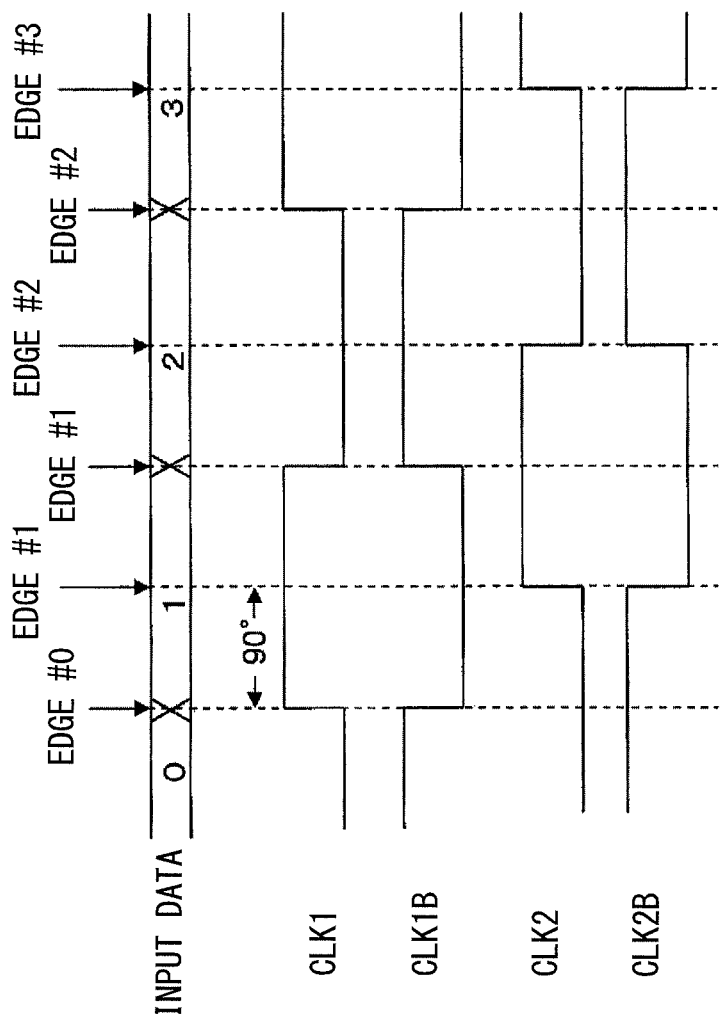
FIG. 9 is a timing chart illustrating four-phase clock signals.

Note that the clock signal CLK11 corresponds to, for example, the clock signal CLK1 in FIG. 9. Similarly, the clock signal CLK12, clock signal CLK13, and clock signal CLK14 correspond to the clock signal CLK2, clock signal CLK1B, and clock signal CLK2B, respectively, in FIG. 9.

The data output circuit 204 extracts data from the input data according to the clock signal CLK12 and clock signal CLK14 supplied from the phase interpolator 207 and outputs the data to the processing circuit 208. The edge output circuit 205 extracts a part at and near an edge of the input data from the input data according to the clock signal CLK11 and clock signal CLK13 supplied from the phase interpolator 207 and outputs the part to the processing circuit 208. The processing circuit 208 extracts edge information from the data and the data at or near the edge input from the circuits 204 and 205 in synchronism with an input clock. The processing circuit 208 performs signal processing such as a process of converting the edge information to a phase signal and then performs specified processing using the phase signal. Simultaneously, the processing circuit 208 outputs the phase signal, i.e., a first control signal PIcode to the phase interpolator 207.

Figure 2:
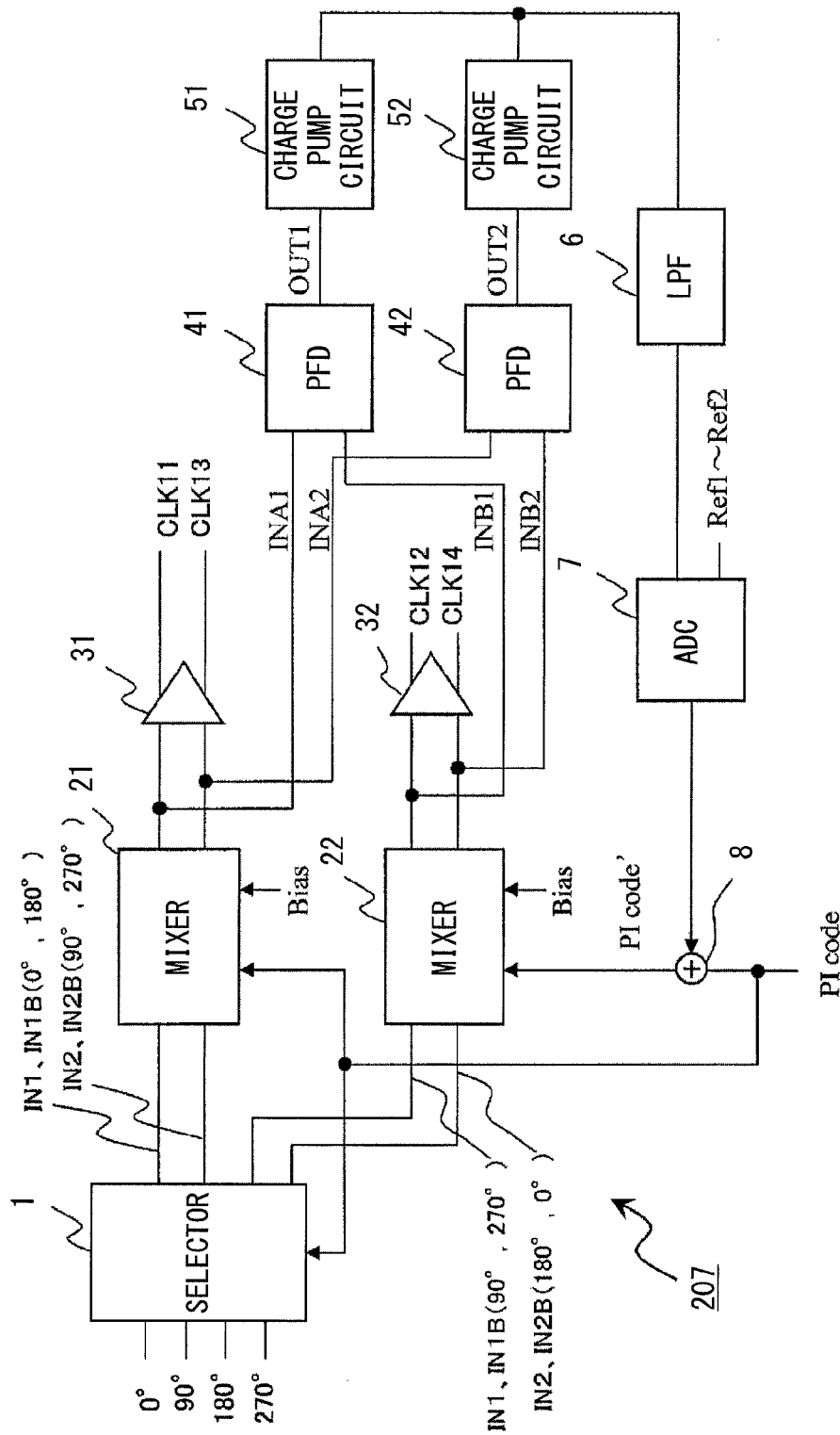
FIG. 2 is a diagram illustrating an example of a phase interpolator.

FIG. 2 is a diagram illustrating an example of a phase interpolator.

The phase interpolator 207 in FIG. 2 includes a selector 1, mixers 21 and 22, output buffer circuits 31 and 32, phase detectors (PFDs: Phase Frequency Detectors) 41 and 42, charge pump circuits 51 and 52, a low-pass filter 6, an analog digital converter (ADC) 7, and an adder 8.

As described above, the four-phase clock signals are supplied from the PLL 206 to the selector 1. The selector 1 supplies the supplied four-phase clock signals to the first mixer 21 and second mixer 22 on the basis of the first control signal PIcode. The first control signal PIcode will be described later.

The mixer 21 receives the input clock signal having a phase lead angle of 0 degrees and simultaneously receives the input clock signal having a phase lead angle of 180 degrees. For example, an input IN1 to the mixer 21 is the clock signal having a phase lead angle of 0 degrees, and an input IN1B is the clock signal having a phase lead angle of 180 degrees. Additionally, the mixer 21 receives the input clock signal having a phase lead angle of 90 degrees and simultaneously receives the input clock signal having a phase lead angle of 270 degrees. For example, an input IN2 to the mixer 21 is the clock signal having a phase lead angle of 90 degrees, and an input IN2B is the clock signal having a phase lead angle of 270 degrees.

The mixer 22 receives the input clock signal having a phase lead angle of 90 degrees and simultaneously receives the input clock signal having a phase lead angle of 270 degrees. For example, an input IN1 to the mixer 22 is the clock signal having a phase lead angle of 90 degrees, and an input IN1B is the clock signal having a phase lead angle of 270 degrees. Additionally, the mixer 22 receives the input clock signal having a phase lead angle of 180 degrees and simultaneously receives the input clock signal having a phase lead angle of 0 degrees. For example, an input IN2 to the mixer 22 is the clock signal having a phase lead angle of 180 degrees, and an input IN2B is the clock signal having a phase lead angle of 0 degrees.

Figure 3:
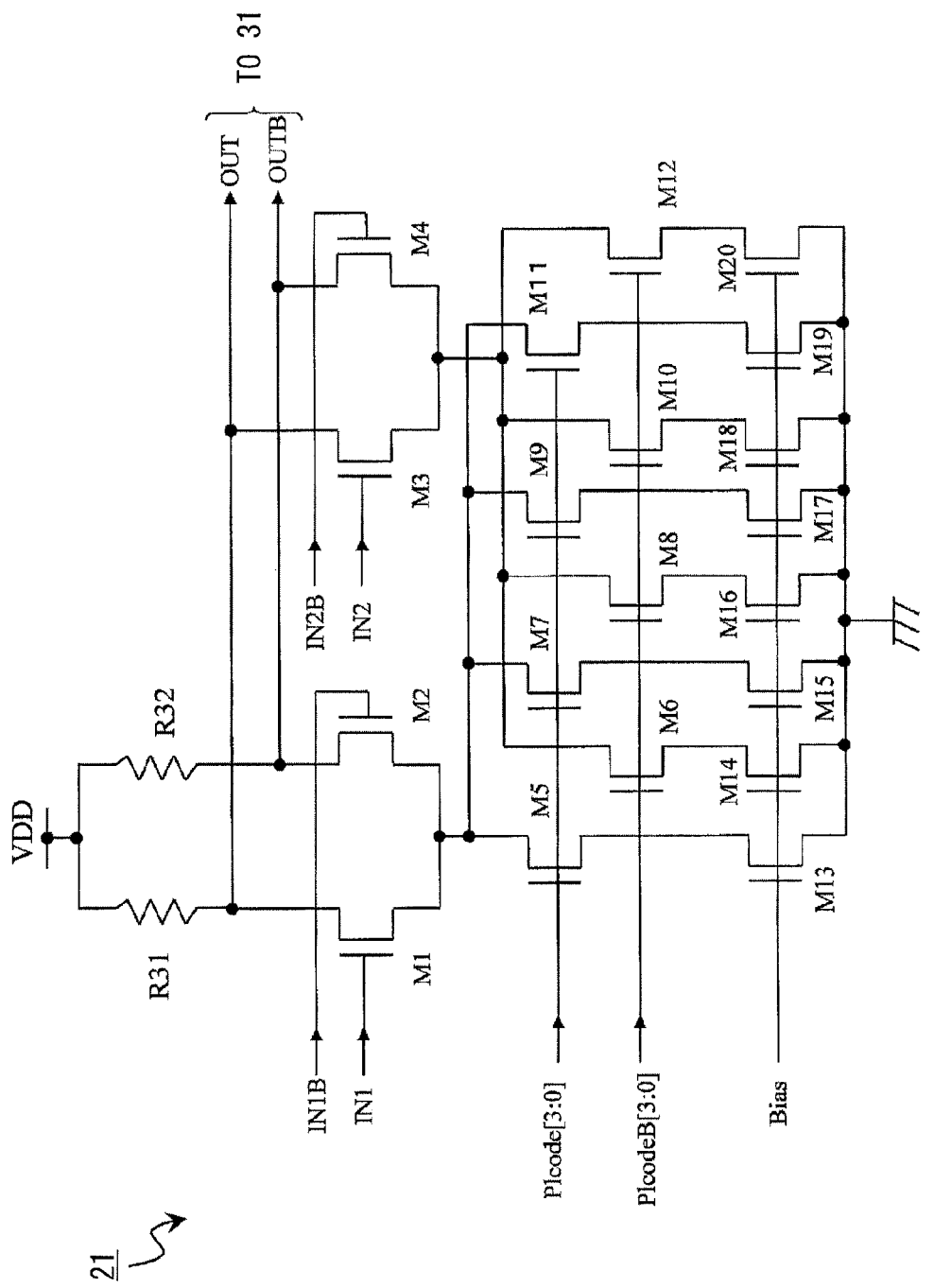
FIG. 3 is a diagram illustrating an example of a mixer.

The mixer 21 generates the first clock signal CLK11 having the desired phase lead angle of $\alpha$ and the second clock signal CLK13 having a phase lead angle of ($\alpha$+180 degrees) which is larger by 180 degrees than that of the clock signal CLK11 on the basis of the clock signals supplied from the selector 1 according to the first control signal PIcode. The first control signal defines the clock signal CLK11 and clock signal CLK13 to be generated by the mixer 21 and also defines a first phase lead angle to be given to the clock signals. Referring to FIG. 3, the first phase lead angle is 0 degrees. The clock signal CLK13 has a phase lead angle of 180 degrees with respect to (has a phase opposite to that of) the clock signal CLK11. Outputs from the mixer 21 are input to the first output buffer circuit 31 corresponding to the mixer 21 and the first and second phase detectors 41 and 42.

The mixer 22 generates the third clock signal CLK12 having a phase lead angle of 90 degrees with respect to the clock signal CLK11 and the fourth clock signal CLK14 having a phase lead angle of 270 degrees with respect to the clock signal CLK11 (i.e., a phase lead angle of 90 degrees with respect to the clock signal CLK13) on the basis of the clock signals supplied from the selector 1 according to a second control signal PIcode'. The second control signal defines the clock signal CLK12 and clock signal CLK14 to be generated by the mixer 22 and also defines a second phase lead angle to be given to the clock signals. Referring to FIG. 3, the second phase lead angle is a value obtained by adding a lead angle corresponding to a phase shift of $\beta$ (to be described later) to 90 degrees. The clock signal CLK14 is a signal having a phase lead angle of 180 degrees with respect to the clock signal CLK12. The clock signal CLK12 and clock signal CLK14 (second differential signals) are signals with phases having phase lead angles of 90 degrees with respect to the clock signal CLK11 and clock signal CLK13 (first differential signals), respectively. Outputs from the mixer 22 are input to the second output buffer circuit 32 corresponding to the mixer 22 and the first and second phase detectors 41 and 42.

The second control signal PIcode' is a signal obtained by adding a value used to generate the clock signal CLK12 and clock signal CLK14 with the phases having phase lead angles of 90 degrees to the first control signal PIcode used to generate the clock signal CLK11 and clock signal CLK13. The secondcontrol signal PIcode' further includes a value used to correct shifts (i.e., leads or lags in phase lead angle) of $\beta$ of the phases of the clock signal CLK12 and clock signal CLK14 for the phases of the clock signal CLK11 and clock signal CLK13. With the addition, the phases of the clock signal CLK12 and clock signal CLK14 are kept to have phase lead angles of exactly 90 degrees with respect to the phases of the clock signal CLK11 and clock signal CLK13.

The phase shifts (e.g., shifts in phase lead angle) of $\beta$ are values obtained by subtracting 90 degrees from the differences in phase lead angle between the phase lead angles of the clock signal CLK11 and clock signal CLK13 and the phases of the clock signal CLK12 and clock signal CLK14. The phase shifts of $\beta$ are undesirable shifts and are values which should desirably be "0."

FIG. 3 is a diagram illustrating an example of a mixer of the phase interpolator.

The mixer 21 includes two differential circuits (a differential pair), eight current sources, and eight control switches. Note that the mixer 22 has the same configuration as the mixer 21 and that the mixer 22 is not illustrated. Also note that the number of current sources and that of control switches are not limited to eight. The numbers of current sources and control switches depend on the resolution at which an arbitrary phase signal is generated.

The two differential circuits include resistors R31 and R32 which are loads common to the two circuits, a first differential circuit which includes N-channel MOS transistors (FETs) M1 and M2, and a second differential circuit which includes N-channel MOS transistors M3 and M4. The input signals IN1, IN1B, IN2, and IN2B are applied to gate electrodes of M1, M2, M3, and M4, respectively. The input signal IN1B is an inverted signal of the input signal IN1. The input signal IN2B is an inverted signal of the input signal IN2. Differential outputs OUT and OUTB are connected to junctions of the resistors R31 and R32 and M1, M2, M3, and M4.

The differential output OUT corresponds to the clock signal having a phase lead angle of $\alpha$ while the differential output OUTB corresponds to the clock signal having a phase lead angle of ($\alpha$+180 degrees). The differential outputs OUT and OUTB are input to the first output buffer circuit 31. The differential output OUT is also input to the first phase detector 41 while the differential output OUTB is also input to the second phase detector 42.

Accordingly, in the mixer 21, the clock signal CLK11 is output to the differential output OUT. The signal is a signal INA1. The clock signal CLK13 is output to the differential output OUTB. The signal is a signal INA2.

In the mixer 22, the clock signal CLK12 is output to a differential output OUT. The signal is a signal INB1. The clock signal CLK14 is output to a differential output OUTB. The signal is a signal INB2.

The eight current sources include M13 to M20. A bias voltage Bias is applied to gate electrodes of M13 to M20. Source electrodes of M13 to M20 are connected to a ground potential. Control switches corresponding to the current sources are connected between drain electrodes of the current sources M13 to M20 and the first and second differential circuits. The first differential circuit is driven by the current sources M13, M15, M17, and M19. The second differential circuit is driven by the current sources M14, M16, M18, and M20.

The eight control switches include control switches M5 to M12 which are provided so as to correspond to the eight current sources. For example, a 4-bit control signal PIcode[3:0] is applied to gate electrodes of the control switches M5, M7, M9, and M11. Each bit of the control signal PIcode[3:0] is applied to one of the control switches M5, M7, M9, and M11 which is associated with the bit in advance. For example, a 4-bit control signal PIcodeB[3:0] is applied to gate electrodes of the control switches M6, M8, M10, and M12. Each bit of the control signal PIcodeB[3:0] is applied to one of the control switches M6, M8, M10, and M12 which is associated with the bit in advance.

PIcodeB[3:0] is an inverted signal of PIcode[3:0]. PIcodeB[3:0] and PIcode[3:0] are both derived from the first control signal PIcode.

The control switches M5 and M6 are paired, the control switches M7 and M8 are paired, the control switches M9 and M10 are paired, and the control switches M11 and M12 are paired. Signals in an inversion relationship with each other are applied to the gate electrodes of each pair of control switches. With this configuration, when one of each pair of control switches is on, the other is off.

For example, when a clock signal with α (=45 degrees) is to be generated, the mixer 21 is controlled in the manner below.

In the first differential circuit, the clock signal having a phase lead angle of 0 degrees is applied as IN1 while the clock signal having a lead angle of 180 degrees with respect to the clock signal having a phase lead angle of 0 degrees (i.e., having a phase lead angle of 180 degrees) is applied as IN1B. In the second differential circuit, the clock signal having a phase lead angle of 90 degrees is applied as IN2 while the clock signal having a lead angle of 180 degrees with respect to the clock signal having a phase lead angle of 90 degrees (i.e., having a phase lead angle of 270 degrees) is applied as IN2B.

For example, PIcode[3:0] to be supplied to the control switches M5, M7, M9, and M11 corresponding to the first differential circuit is set to (1, 1, 0, 0) while PIcodeB[3:0] to be supplied to the control switches M6, M8, M10, and M12 corresponding to the second differential circuit is set to (0, 0, 1, 1). The setting is equivalent to a process of making a weight assigned to IN1 having a phase lead angle of 0 degrees and a weight assigned to IN2 having a phase lead angle of 90 degrees equal to each other and setting a weight assigned to IN1B having a phase lead angle of 180 degrees and a weight assigned to IN2B having a phase lead angle of 270 degrees to "0."

The setting turns on M5 and M7 and turns off M9 and M11. Also, the setting turns off M6 and M8 and turns on M10 and M12. As a result, drive currents equal in magnitude flow into the first differential circuit and second differential circuit. For this reason, the clock signal having a phase lead angle of 0 degrees as IN1 and the clock signal having a phase lead angle of 90 degrees as IN2 are combined at a 1:1 ratio, and a clock signal having a phase lead angle of α (=45 degrees) is generated and output to the differential output OUT. At the same time, a signal with a phase of 225 degrees having a clock signal lead angle of 180 degrees with respect to the clock signal having a phase lead angle of α (=45 degrees) is output to the differential output OUTB. As can be seen from the foregoing, the mixer 1 outputs a clock signal (differential signal) having a phase lead angle of α and a clock signal (differential signal) having a phase lead angle of (α+180 degrees).

For example, when a clock signal having a phase lead angle of α (=22.5 degrees) is to be generated, PIcode[3:0] is set to (1, 1, 1, 0) while PIcodeB[3:0] is set to (0, 0, 0, 1). The setting is equivalent to a process of setting the ratio between the weight assigned to IN1 having a phase lead angle of 0 degrees and the weight assigned to IN2 having a phase lead angle of 90 degrees to 3:1 and setting the weight assigned to IN1B having a phase lead angle of 180 degrees and the weight assigned to IN2B having a phase lead angle of 270 degrees to "0."

As described above, although the mixer 22 has the same configuration as the mixer 21, the mixer 22 receives the second control signal PIcode' instead of the first control signal PIcode. For this reason, the mixer 22 outputs respective differential signals having phase lead angles of 90 degrees with respect to the differential signals output by the mixer 21, i.e., clock signals (differential signals) having a phase lead angle of (α+90 degrees) and a phase lead angle of (α+270 degrees).

As described above, if there are shifts of β of the phases of the clock signal CLK12 and clock signal CLK14 for the phases of the clock signal CLK11 and clock signal CLK13, the second control signal PIcode' includes an added value used to correct the shifts of β in phase. The value keeps the clock signal CLK12 and clock signal CLK14 exactly 90 degrees out of phase with the clock signal CLK11 and clock signal CLK13. If there are no shifts of β in phase, the second control signal PIcode' includes no added value used to correct the shifts of β in phase.

Referring to FIG. 2, the first output buffer circuit 31 is an output circuit of the phase interpolator and outputs signals output from output terminals of the mixer 21 as output signals of the phase interpolator. The second output buffer circuit 32 is an output circuit of the phase interpolator and outputs signals output from output terminals of the mixer 22 as output signals of the phase interpolator. As can be seen from the foregoing, the phase interpolator outputs differential signals including clock signals having a phase lead angle of α and a phase lead angle of (α+180 degrees) and differential signals having phase lead angles of 90 degrees with respect to the differential signals, i.e., differential signals including clock signals having a phase lead angle of (α+90 degrees) and a phase lead angle of (α+270 degrees).

The first phase detector 41 computes the exclusive OR of the clock signal CLK11 (the clock signal having a phase lead angle of α) output from the mixer 21 and the clock signal CLK12 (the clock signal having a phase lead angle of (α+90 degrees)) output from the mixer 22. The first phase detector 41 inputs the computed exclusive OR to the first charge pump circuit 51 corresponding to the first phase detector 41. The second phase detector 42 computes the exclusive OR of the clock signal CLK13 (the clock signal having a phase lead angle of (α+180 degrees)) output from the mixer 21 and the clock signal CLK14 (the clock signal having a phase lead angle of (α+270 degrees)) output from the mixer 22. The second phase detector 42 inputs the computed exclusive OR to the second charge pump circuit 52 corresponding to the second phase detector 42.

Figure 4A:
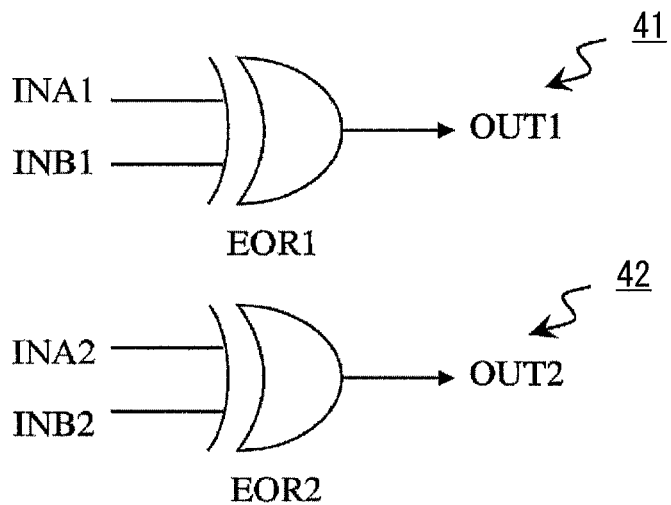
FIG. 4 are diagrams illustrating respective examples of phase detectors, a charge pump circuit, and a filter circuit.

FIG. 4A is a diagram illustrating examples of phase detectors (PFDs).

The phase detector 41 is an exclusive OR circuit EOR1. The phase detector 41 receives the signal INA1 from the mixer 21 and the signal INB1 from the mixer 22. The phase detector 41 obtains a result of the exclusive OR operation (EOR) between the signal INA1 and the signal INB1 and outputs the result as a signal OUT1.

The phase detector 42 is an exclusive OR circuit EOR2. The phase detector 42 receives the signal INA2 from the mixer 21 and the signal INB2 from the mixer 22. The signal INA2 is an inverted signal (=INA1B) of the signal INA1. The signal INB2 is an inverted signal (=INB1B) of the signal INB1. The phase detector 42 obtains a result of the exclusive OR operation (EOR) between the signal INA2 and the signal INB2 and outputs the result as a signal OUT2.

The first charge pump circuit 51 converts the result of the exclusive OR operation output from the phase detector 41 to a first voltage signal. The second charge pump circuit 52 converts the exclusive OR output from the phase detector 42 to a second voltage signal. An output terminal of the first charge pump circuit 51 and an output terminal of the second charge pump circuit 52 are connected to each other. Accordingly, a signal obtained by combining the first voltage signal and second voltage signal is input to the low-pass filter 6.

Figure 4B:
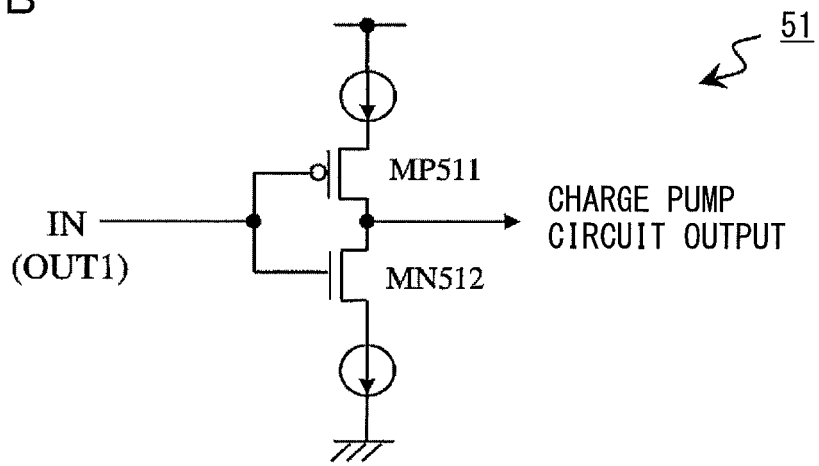

FIG. 4B is a diagram illustrating an example of a charge pump circuit.

The charge pump circuit 51 includes analog switching circuits and two constant current sources which are sandwiched between the analog switching circuits and two power supplies, respectively. The analog switching circuits are composed of a p-channel MOSFET MP511 and an n-channel MOSFET MN512. The signal OUT1 from the phase detector 41 is input as an input IN to the charge pump circuit 51. The charge pump circuit 51 forms an inverted signal of the input signal OUT1 and outputs the signal as a charge pump circuit output.

Although not illustrated in FIG. 4B, the charge pump circuit 52 has the same configuration as the charge pump circuit 51. The charge pump circuit 52 receives the signal OUT2 from the phase detector 42 as an input IN, forms an inverted signal of the signal OUT2, and outputs the signal as a charge pump circuit output.

The low-pass filter 6 is provided between the first and second charge pump circuits 51 and 52 and the ADC 7. The low-pass filter 6 filters a signal obtained by combining the first voltage signal and second voltage signal with an RC circuit to cut high-frequency components. An output from the low-pass filter 6 (an LPF output) is a signal which is generated on the basis of the composite signal of the first voltage signal and second voltage signal. The LPF output is input to the ADC 7.

Figure 4C:
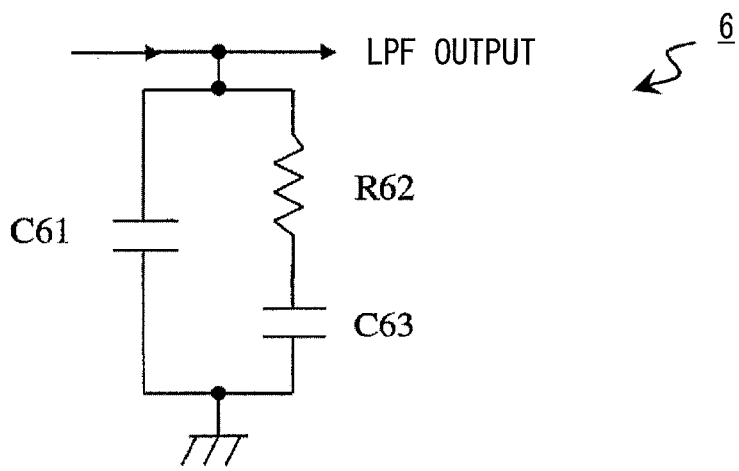

FIG. 4C is a diagram illustrating an example of a low-pass filter.

The low-pass filter (LPF) 6 is a filter circuit including a resistor R62 and a capacitor C63 which are series-connected and a capacitor C61 which is connected in parallel to the series circuit. The charge pump circuit outputs from the two charge pump circuits 51 and 52 are both input to the low-pass filter 6. The capacitors C61 and C63 are charged by the charge pump circuit outputs from the charge pump circuits 51 and 52 or electricity is discharged from the capacitors C61 and C63 to the charge pump circuit outputs. The low-pass filter 6 outputs, as the LPF output, a level (a voltage signal) to which the capacitors C61 and C63 are charged.

The ADC 7 generates a digital signal on the basis of a signal which is generated on the basis of the composite signal of the first voltage signal output from the first charge pump circuit 51 and the second voltage signal output from the second charge pump circuit 52, i.e., the LPF output. An output from the ADC 7 is input to the adder 8.

FIG. 5 is a diagram illustrating an example of an analog digital converter (ADC).

The ADC 7 includes a plurality of resistors R71 to R73, a plurality of comparators 71 and 72, and an encoder 73. The number of resistors R71 to R73 is not limited to 3, and the number of comparators 71 and 72 is not limited to 2.

The plurality of resistors R71 to R73 are series-connected between a power supply voltage VDD and a ground potential, and the power supply voltage VDD is divided into a plurality of voltage values Ref1 to Ref2. In other words, voltages at junctions of the plurality of resistors R71 to R73 are input as the reference voltages Ref1 to Ref2 to one input terminals of the plurality of comparators 71 to 72. The LPF output from the low-pass filter 6 is input to the other input terminals of the plurality of comparators 71 to 72. The plurality of comparators 71 to 72 compare the input reference voltages Ref1 to Ref2, respectively, with the LPF output. In a specified case, the plurality of comparators 71 to 72 generate an output of "1" and inputs the output to the encoder 73. Note that the reference voltages Ref1 to Ref2 formed inside the ADC 7 are illustrated outside the ADC 1 in FIG. 1.

The encoder 73 converts the LPF output from the low-pass filter 6 to a digital signal on the basis of the outputs from the plurality of comparators 71 to 72 and converts the digital signal obtained after the conversion to a value to be added to PIcode.

At the time of the conversion, if there are no shifts of $\beta$ of the phases of the clock signal CLK12 and clock signal CLK14 for the phases of the clock signal CLK11 and clock signal CLK13, the encoder 73 sets, as the value to be added, a value used to generate the clock signal CLK12 and clock signal CLK14 having phase lead angles of 90 degrees with respect to the clock signal CLK11 and clock signal CLK13. Accordingly, if the LPF output is a predetermined value, the encoder 73 outputs the digital signal so as to set shifts of the phases of the clock signal CLK12 and clock signal CLK14 from the phases of the clock signal CLK11 and clock signal CLK13 to 90 degrees.

For this reason, the ADC 7 basically uses a value to be taken by the LPF output as a reference voltage for the ADC 7 when shifts of the phases of the clock signal CLK12 and clock signal CLK14 from the phases of the clock signal CLK12 and clock signal CLK14 are 90 degrees. A value of ½ Vdd which is half the power supply voltage Vdd is thus used as the reference voltage.

Figure 7:
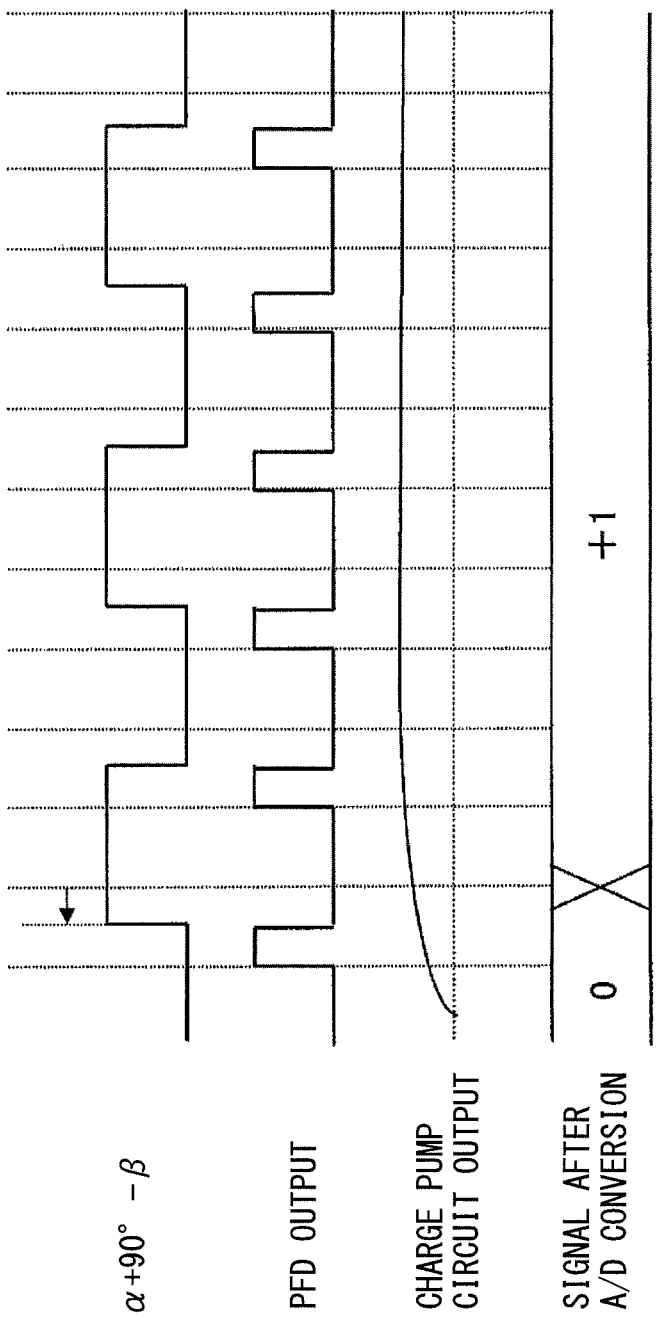
FIG. 7 is a chart for explaining the operation of the phase interpolator.

Actually, in the example in FIG. 7, the power supply voltage Vdd is divided such that the shifts in phase have a margin for phase in either direction of a lead angle of 90 degrees. With the division, the voltage Ref1 higher than ½ Vdd and the voltage Ref lower than ½ Vdd are generated, and the voltages Ref1 and Ref2 are used as respective voltages Ref of the comparators 71 and 72.

If there are shifts of $\beta$ in phase, the encoder 73 sets, as the value to be added, the sum of the value used to generate the signals having phase lead angles of 90 degrees and a value used to correct the shifts of $\beta$ in phase.

For example, the first control signal PIcode from a control circuit and an output from the ADC 7 are input to the adder 8. The adder 8 adds the digital signal output from the ADC 7 to the first control signal PIcode to generate the second control signal PIcode' and supplies the second control signal PIcode' to the mixer 22. With the second control signal PIcode', the mixer 22 can output, as differential signals to be output, signals having phase lead angles of 90 degrees with respect to differential signals to be output by the mixer 21.

Figure 6:
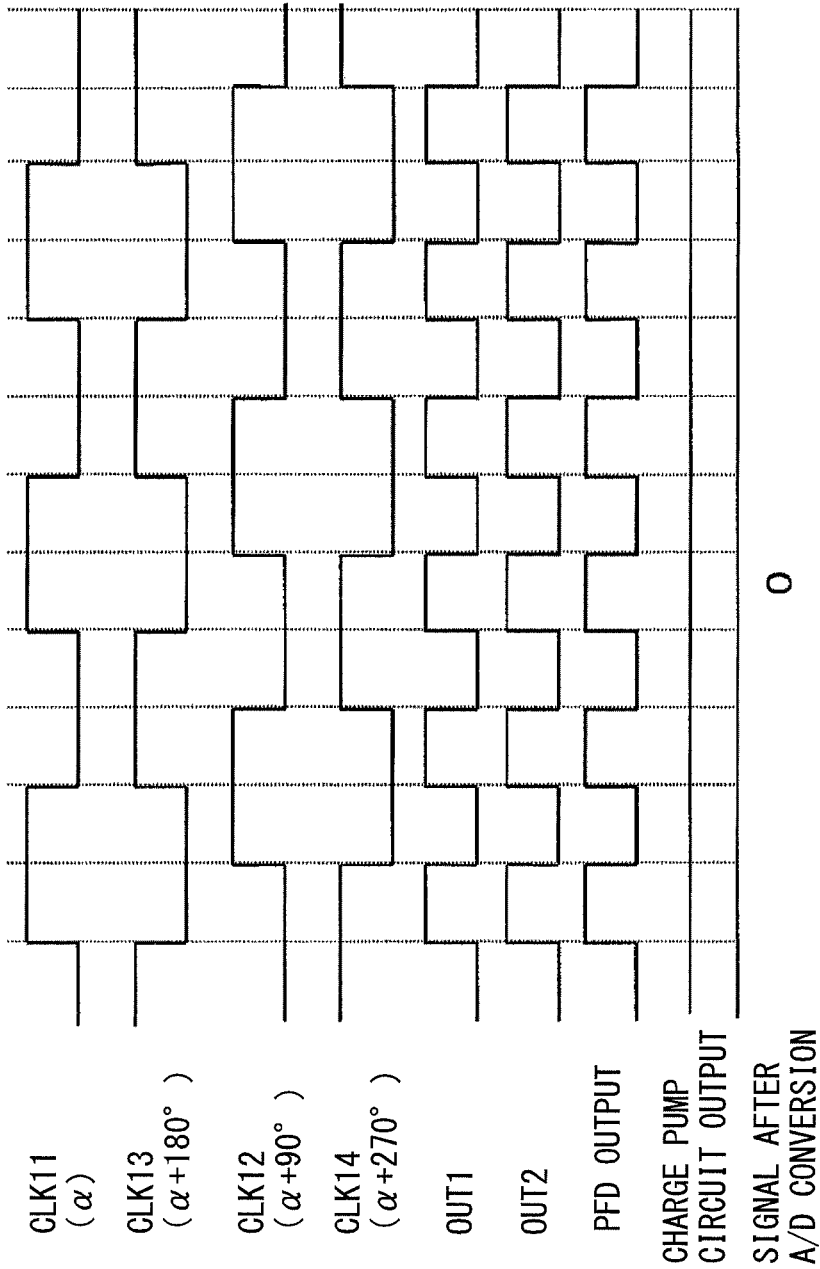
FIG. 6 is a chart for explaining the operation of the phase interpolator.
Figure 8:
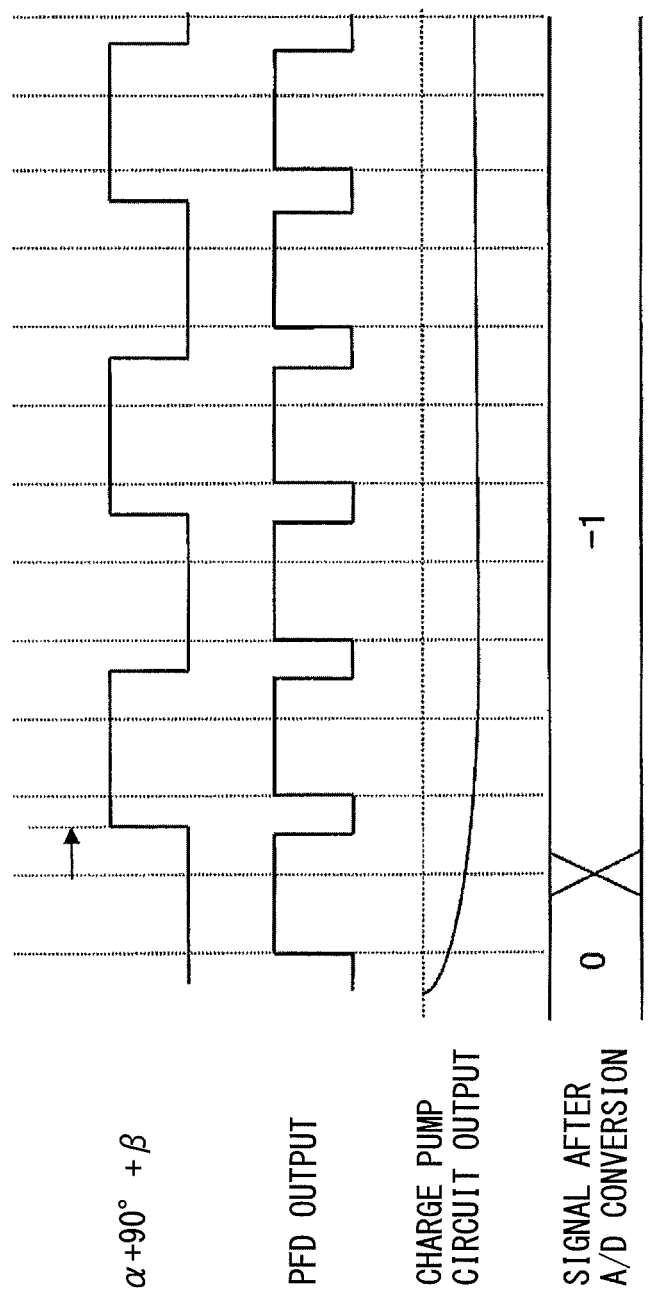
FIG. 8 is a chart for explaining the operation of the phase interpolator.

FIGS. 6 to 8 are timing charts of the phase interpolator. FIG. 6 illustrates a case where the differences in phase lead angle between outputs from the phase interpolator 207 are kept at exactly 90 degrees. FIG. 7 illustrates a case where the differences in phase lead angle between outputs from the phase interpolator 207 are less than 90 degrees. FIG. 8 illustrates a case where the differences in phase lead angle between outputs from the phase interpolator 207 are more than 90 degrees.

FIG. 6 illustrates a state in which four-phase clock signals having phase lead angles of α, (α+90 degrees), (α+180 degrees), and (α+270 degrees) are generated on the basis of four-phase clock signals having phase lead angles of 0 degrees, 90 degrees, 180 degrees, and 270 degrees. In other words, the mixer 21 outputs a differential signal having a desired phase lead angle of α, and the mixer 22 outputs a differential signal having a phase lead angle of (α+90 degrees) which has a lead angle of 90 degrees with respect to the signals. As described above, reference character a denotes a desired phase lead angle.

Accordingly, an output from the phase detector 41 is the exclusive OR of the signal having a phase lead angle of α and the signal having a phase lead angle of (α+90 degrees). As illustrated in FIG. 6, the signal OUT1 is at high level ("1") during a period when one of the inputs is at high level and is at low level during the other periods. An output from the phase detector 42 is the exclusive OR of a signal having a phase lead angle of (α+180 degrees) and a signal having a phase lead angle of (α+270 degrees). As illustrated in FIG. 6, the signal OUT2 is at high level ("1") during a period when one of the inputs is at high level and is at low level during the other periods.

Accordingly, a PFD output which is a result of combining the signal OUT1 from the phase detector (PFD) 41 and the signal OUT2 from the phase detector 42 is as illustrated in FIG. 6.

The charge pump circuits 51 and 52 output inverted signals of the signals OUT1 from the phase detectors 41 and 42. Accordingly, the charge pump circuits 51 and 52 charge the capacitor C61 and capacitor C63 of the low-pass filter 6 during a period when an inverted signal of the PFD output in FIG. 6 is at high level and discharge the capacitor 61 and capacitor C63 of the low-pass filter 6 during a period when the signal is at low level.

In FIG. 6, the differences in phase lead angle between outputs from the phase interpolator 207 is 90 degrees. Accordingly, the duration of a high-level period and that of a low-level period are equal in the PFD output in FIG. 6. In other words, the duration of the charge time and that of the discharge time of the capacitor C61 and capacitor C63 of the low-pass filter 6 are equal.

As a result, a charge pump circuit output which is a result of combining outputs from the charge pump circuits 51 and 52 is a signal having a predetermined voltage value. The predetermined voltage value is, for example, ½ the power supply voltage Vdd (½ Vdd). As described above, the voltage value is used as the reference voltage for the ADC 7. In this case, the encoder 73 of the ADC 7 outputs only a value corresponding to a phase lead angle of 90 degrees. The output PIcode' from the adder 8 is a value obtained by adding the value corresponding to a phase lead angle of 90 degrees to PIcode. As a result, the four-phase clock signals CLK11, CLK12, CLK13, and CLK14 output by the two mixers 21 and 22 correctly maintain the differences in phase lead angle.

In FIG. 7, the differences in phase lead angle between the outputs from the phase interpolator 207 are less than 90 degrees. In other words, as shown in FIG. 7, a signal which is supposed to differ in phase lead angle by 90 degrees from a clock signal having a phase lead angle of α has a phase leading by β.

For this reason, the duration of a high-level period and that of a low-level period are not equal in a PFD output in FIG. 7. The duration of the charge time and that of the discharge time of the capacitor C61 and capacitor C63 of the low-pass filter 6 are also not equal. That is, if the duty ratio of the PFD output is not 1:1, the ratio between the duration of the charge time and that of the discharge time of the capacitor 61 and capacitor 63 of the low-pass filter 6 is not 1:1. More specifically, as illustrated in FIG. 7, in the PFD output that is the result of combining the outputs from the two phase detectors (PFDs) 41 and 42, a high-level period is shorter than ¼ the period of the PFD output, i.e., shorter than a period corresponding to a phase lead angle of 90 degrees of one cycle of 360 degrees. A high-level period corresponds to the lead angle of β, by which the phase is leading.

As a result, a charge pump circuit output that is the result of combining the outputs from the charge pump circuits 51 and 52 increases gradually to reach a value higher than the original value of ½ Vdd by a value corresponding to the lead angle of β, by which the phase is leading. Accordingly, an output from the ADC 7 increases to a value larger than the original value of "0" by a value corresponding to the lead angle of β, by which the phase is leading. The output PIcode' from the adder 8 is a value obtained by adding a value corresponding to the original difference in phase lead angle of 90 degrees and the value corresponding to the lead angle of β, by which the phase is leading, to PIcode. In other words, the output PIcode' from the adder 8 is a value for causing the (leading) phase at the time to lag.

Accordingly, the control signal PIcode' for causing the current phase to lag behind that of the mixer 21 is input to the mixer 22. As a result, the four-phase clock signals CLK11, CLK12, CLK13, and CLK14 output by the two mixers 21 and 22 are connected to have correct differences in phase lead angle of 90 degrees.

In FIG. 8, the differences in phase lead angle between the outputs from the phase interpolator 207 are more than 90 degrees. In other words, as illustrated in FIG. 8, a signal which is supposed to differ in phase lead angle by 90 degrees from a clock signal having a phase lead angle of α has a phase lagging by β. As illustrated in FIG. 7, in a PFD output that is the result of combining the outputs from the two phase detectors (PFDs) 41 and 42, a high-level period is longer than ¼ the period of the PFD output, i.e., longer than a period corresponding to a phase lead angle of 90 degrees of one cycle of 360 degrees. A high-level period corresponds to the lead angle of β, by which the phase is lagging.

As a result, a charge pump circuit output that is the result of combining the outputs from the charge pump circuits 51 and 52 decreases gradually to reach a value lower than the original value of ½ Vdd by a value corresponding to the lead angle of β, by which the phase is lagging. Accordingly, the output from the ADC 7 decreases to a value smaller than the original value of "0" by a value corresponding to the lead angle of β, by which the phase is lagging. The output PIcode' from the adder 8 is a value obtained by adding a value corresponding to the original differences in phase lead angle of 90 degrees to PIcode and subtracting a value corresponding to the lead angle of β, by which the phase is lagging, from the sum. In other words, the output PIcode' from the adder 8 is a value for causing the (leading) phase at the time to lead.

Accordingly, the control signal PIcode' for causing the current phase to lead that of the mixer 21 is input to the mixer 22. As a result, the four-phase clock signals CLK11, CLK12, CLK13, and CLK14 output by the two mixers 21 and 22 are corrected to have correct differences in phase lead angle of 90 degrees.

The above-described embodiment is an example in which the four-phase clock signals CLK11, CLK12, CLK13, and CLK14 are kept to have correct differences in phase lead angle of 90 degrees. The differences in phase lead angle may be a value other than 90 degrees.

For example, it may not be best to take in data at the center of a period defined by an up-edge and a down-edge of a clock, i.e., in synchronism with a signal having a lead angle of 90 degrees with respect to an edge, depending on conditions such as the signal transmission path 300 and the like. Data may be taken in more correctly when data is taken in in synchronism with a signal having a lead angle different from a lead angle of 90 degrees.

In this case, for example, the first mixer 21 generates the clock signal CLK11 having a phase lead angle of α and the clock signal CLK13 having a phase lead angle of 180 degrees with respect to the clock signal CLK11 according to the first control signal PIcode, as described above. In other words, the phase lead angle of the clock signal CLK13 is (α+180 degrees).

The mixer 22 generates the clock signal CLK12 whose phase lead angle with respect to the clock signal CLK11 has a value obtained by adding a specified lead angle adjustment value x to or subtracting the specified lead angle adjustment value x from 90 degrees and the clock signal CLK14 whose phase lead angle with respect to the clock signal CLK11 has a value obtained by adding the specified lead angle adjustment value x to or subtracting the specified lead angle adjustment value x from 270 degrees according to the second control signal PIcode'. In other words, the phase lead angle of the clock signal CLK12 is (α+90 degrees±x) while the phase lead angle of the clock signal CLK14 is (α+270 degrees±x). In this case, the differences in phase lead angle of the clock signals CLK12 and CLK14 from the clock signals CLK11 and CLK13 are (90 degrees±x).

For this reason, during a process of generating the second control signal PIcode', a digital signal output from the ADC 7 to be added to the first control signal PIcode is generated in the manner below. For example, the ADC 7 generates the digital signal from a signal which is generated on the basis of the composite signal of the first voltage signal output from the first charge pump circuit 51 and the second voltage signal output from the second charge pump circuit 52 and a signal (hereinafter referred to as an adjustment signal) which gives a signal magnitude corresponding to the specified lead angle adjustment value x in the second control signal PIcode'.

More specifically, the voltages Ref1 and Ref2 to be input to the comparators 71 and 72 of the ADC 7 are made variable. Accordingly, the voltages Ref1 and Ref2 are voltage signals including an adjustment signal. In other words, the voltages Ref1 and Ref2 are each the sum of or the difference between a signal component for setting the differences in phase lead angle of the clock signals CLK12 and CLK14 from the clock signals CLK11 and CLK13 to 90 degrees and a signal component for setting the differences in phase lead angle of the clock signals CLK12 and CLK14 from the clock signals CLK11 and CLK13 to the lead angle adjustment value x (a signal component of the adjustment signal).

For example, the voltages Ref1 and Ref2 are generally set to have signal components for setting the differences in lead angle to 90 degrees. The signal components are default values for the voltages Ref1 and Ref2.

In order to set the differences in lead angle to (90 degrees+x), the voltages Ref1 and Ref2 are each set to the sum of a signal component for setting the differences in lead angle to 90 degrees and a signal component for setting the differences in lead angle to the lead angle adjustment value x. In order to set the differences in lead angle to (90 degrees−x), the voltages Ref1 and Ref2 are each set to the difference between the signal component for setting the differences in lead angle to 90 degrees and the signal component for setting the differences in lead angle to the lead angle adjustment value x.

For this reason, for example, a variable resistor is used as the resistor R73. The voltages Ref1 and Ref2 can be changed by changing the value of the resistor R73. A control signal for the resistor R73 is input via, e.g., the input terminal of the LSI chip 200 and is set in a register for storing the value of a control signal. The value of a control signal for the resistor R73 is determined on the basis of, e.g., a result of a test on transmission of data between the LSI chip 100 and the LSI chip 200. This allows data to be taken in in synchronism with a signal having a lead angle different from a lead angle of 90 degrees during a period defined by an up-edge and a down-edge of a clock, instead of being taken in at the center of the period. Accordingly, data can be taken in more accurately.

According to the disclosed phase interpolator, it is possible to achieve a phase interpolator which outputs four-phase clock signals having phase lead angles of exactly 90 degrees with respect to each other and accurately detect a transmitted signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A phase interpolator, comprising:
a selector that supplies four-phase clock signals to a first mixer and a second mixer;
the first mixer that generates a first clock signal having a first phase lead angle and a second clock signal having a phase lead angle of 180 degrees with respect to the first clock signal on the basis of the clock signals supplied from the selector according to a first control signal defining the first clock signal and the second clock signal to be generated and the first phase lead angle to be given to the clock signals;
the second mixer that generates a third clock signal having a phase lead angle of 90 degrees with respect to the first clock signal and a fourth clock signal having a phase lead angle of 270 degrees with respect to the first clock signal on the basis of the clock signals supplied from the selector according to a second control signal defining the third clock signal and the fourth clock signal to be generated and the second phase lead angle to be given to the clock signals;

a first phase detector that computes an exclusive OR of the first clock signal output from the first mixer and the third clock signal output from the second mixer;
a second phase detector that computes an exclusive OR of the second clock signal output from the first mixer and the fourth clock signal output from the second mixer;
a first charge pump circuit that converts the exclusive OR output from the first phase detector to a first voltage signal;
a second charge pump circuit that converts the exclusive OR output from the second phase detector to a second voltage signal;
an analog digital converter that generates a digital signal from a signal generated on the basis of a composite signal of the first voltage signal output from the first charge pump circuit and the second voltage signal output from the second charge pump circuit; and
an adder that adds the digital signal output from the analog digital converter to the first control signal to generate the second control signal and supplies the second control signal to the second mixer.

2. The phase interpolator according to claim 1, wherein the analog digital converter outputs the digital signal so as to set shifts of phases of the third and fourth clock signals from phases of the first and second clock signals to 90 degrees if the signal generated on the basis of the composite signal of the first voltage signal and the second voltage signal has a predetermined value.

3. The phase interpolator according to claim 2, wherein the analog digital converter uses, as a reference voltage for the analog digital converter, a value to be taken by the signal generated on the basis of the composite signal of the first voltage signal and the second voltage signal when the shifts of the phases of the third and fourth clock signals from the phases of the first and second clock signals are 90 degrees.

4. The phase interpolator according to claim 1, further comprising:
a low-pass filter provided between the first and second charge pump circuits and the analog digital converter that filters the composite signal of the first voltage signal and the second voltage signal.

5. A semiconductor circuit device, comprising:
a phase interpolator, the phase interpolator comprising
a selector that supplies four-phase clock signals to a first mixer and a second mixer,
the first mixer that generates a first clock signal having a first phase lead angle and a second clock signal having a phase lead angle of 180 degrees with respect to the first clock signal on the basis of the clock signals supplied from the selector according to a first control signal defining the first clock signal and the second clock signal to be generated and the first phase lead angle to be given to the clock signals,
the second mixer that generates a third clock signal having a phase lead angle of 90 degrees with respect to the first clock signal and a fourth clock signal having a phase lead angle of 270 degrees with respect to the first clock signal on the basis of the clock signals supplied from the selector according to a second control signal defining the third clock signal and the fourth clock signal to be generated and the second phase lead angle to be given to the clock signals,
a first phase detector that computes an exclusive OR of the first clock signal output from the first mixer and the third clock signal output from the second mixer, a second phase detector that computes an exclusive OR of the second clock signal output from the first mixer and the fourth clock signal output from the second mixer,
a first charge pump circuit that converts the exclusive OR output from the first phase detector to a first voltage signal,
a second charge pump circuit that converts the exclusive OR output from the second phase detector to a second voltage signal,
an analog digital converter that generates a digital signal from a signal generated on the basis of a composite signal of the first voltage signal output from the first charge pump circuit and the second voltage signal output from the second charge pump circuit, and
an adder that adds the digital signal output from the analog digital converter to the first control signal to generate the second control signal and supplies the second control signal to the second mixer;
a PLL circuit that supplies the four-phase clock signals to the selector;
an input buffer circuit that inputs a received input signal to an edge output circuit and a data output circuit;
the edge output circuit that extracts an edge from the input signal according to the first clock signal and the second clock signal output from the first mixer; and
the data output circuit that extracts data from the input signal according to the third clock signal and the fourth clock signal output from the second mixer.

6. A phase interpolator, comprising:
a selector that supplies four-phase clock signals to a first mixer and a second mixer;
the first mixer that generates a first clock signal having a first phase lead angle and a second clock signal having a phase lead angle of 180 degrees with respect to the first clock signal on the basis of the clock signals supplied from the selector according to a first control signal defining the first clock signal and the second clock signal to be generated and the first phase lead angle to be given to the clock signals;
the second mixer that generates a third clock signal having a phase lead angle, whose value is obtained by adding a specified lead angle adjustment value to or subtracting the specified lead angle adjustment value from 90 degrees, with respect to the first clock signal and a fourth clock signal having a phase lead angle, whose value is obtained by adding the specified lead angle adjustment value to or subtracting the specified lead angle adjustment value from 270 degrees, with respect to the first clock signal on the basis of the clock signals supplied from the selector according to a second control signal defining the third clock signal and the fourth clock signal to be generated and the second phase lead angle to be given to the clock signals;
a first phase detector that computes an exclusive OR of the first clock signal output from the first mixer and the third clock signal output from the second mixer;
a second phase detector that computes an exclusive OR of the second clock signal output from the first mixer and the fourth clock signal output from the second mixer;
a first charge pump circuit that converts the exclusive OR output from the first phase detector to a first voltage signal;
a second charge pump circuit that converts the exclusive OR output from the second phase detector to a second voltage signal;

an analog digital converter that generates a digital signal from a signal generated on the basis of a composite signal of the first voltage signal output from the first charge pump circuit and the second voltage signal output from the second charge pump circuit and a signal that gives a signal magnitude corresponding to the specified lead angle adjustment value in the second control signal; and an adder that adds the digital signal output from the analog digital converter to the first control signal to generate the second control signal and supplies the second control signal to the second mixer.

7. A semiconductor circuit device, comprising:

a phase interpolator, the phase interpolator comprising a selector that supplies four-phase clock signals to a first mixer and a second mixer, the first mixer that generates a first clock signal having a first phase lead angle and a second clock signal having a phase lead angle of 180 degrees with respect to the first clock signal on the basis of the clock signals supplied from the selector according to a first control signal defining the first clock signal and the second clock signal to be generated and the first phase lead angle to be given to the clock signals, the second mixer that generates a third clock signal having a phase lead angle, whose value is obtained by adding a specified lead angle adjustment value to or subtracting the specified lead angle adjustment value from 90 degrees, with respect to the first clock signal and a fourth clock signal having a phase lead angle, whose value is obtained by adding the specified lead angle adjustment value to or subtracting the specified lead angle adjustment value from 270 degrees, with respect to the first clock signal on the basis of the clock signals supplied from the selector according to a second control signal defining the third clock signal and the fourth clock signal to be generated and the second phase lead angle to be given to the clock signals, a first phase detector that computes an exclusive OR of the first clock signal output from the first mixer and the third clock signal output from the second mixer, a second phase detector that computes an exclusive OR of the second clock signal output from the first mixer and the fourth clock signal output from the second mixer, a first charge pump circuit that converts the exclusive OR output from the first phase detector to a first voltage signal, a second charge pump circuit that converts the exclusive OR output from the second phase detector to a second voltage signal, an analog digital converter that generates a digital signal from a signal generated on the basis of a composite signal of the first voltage signal output from the first charge pump circuit and the second voltage signal output from the second charge pump circuit and a signal that gives a signal magnitude corresponding to the specified lead angle adjustment value in the second control signal, and an adder that adds the digital signal output from the analog digital converter to the first control signal to generate the second control signal and supplies the second control signal to the second mixer;

a PLL circuit that supplies the four-phase clock signals to the selector;

an input buffer circuit that inputs a received input signal to an edge output circuit and a data output circuit;

the edge output circuit that extracts an edge from the input signal according to the first clock signal and the second clock signal output from the first mixer; and the data output circuit that extracts data from the input signal according to the third clock signal and the fourth clock signal output from the second mixer.

* * * * *